United States Patent [19]
Yonezawa et al.

[11] Patent Number: 5,398,166
[45] Date of Patent: Mar. 14, 1995

[54] ELECTRONIC COMPONENT AND MOUNTING STRUCTURE THEREOF

[75] Inventors: Masao Yonezawa; Akiyoshi Moriyasu, both of Nagaokakyo, Japan

[73] Assignee: Murata Manufacturing Co., Ltd., Kyoto, Japan

[21] Appl. No.: 245,924

[22] Filed: May 19, 1994

[30] Foreign Application Priority Data

May 24, 1993 [JP] Japan .............................. 5-027059 U

[51] Int. Cl.⁶ .............................................. H05K 1/11
[52] U.S. Cl. ..................................... 361/784; 361/758;
361/760; 361/770; 361/772; 361/785; 361/825;
174/260; 174/261; 174/266; 257/690; 257/692;
257/693; 439/78
[58] Field of Search ............... 361/742, 758, 770, 804,
361/772–776, 825, 784–785, 790–791, 760–761;
174/260–263, 266; 257/690, 692–693; 439/78,
83–84

[56] References Cited

U.S. PATENT DOCUMENTS

| | | | |
|---|---|---|---|
| 4,387,413 | 6/1983 | Griffis | 361/773 |
| 4,807,087 | 2/1989 | Sawaya | 439/83 |

Primary Examiner—Bot LeDynh
Attorney, Agent, or Firm—Jordan and Hamburg

[57] ABSTRACT

An electronic component includes a substrate having chip parts. First lead terminals and second lead terminals are led out from one end of the substrate toward an outside. The first lead terminal has a holding portion at an intermediate portion. The second lead terminal has a connecting portion for connecting to the substrate and an inserting portion for inserting to the hole of an external circuit board. The connecting portion and the inserting portion of the second lead terminal is connected with an oblique portion. The holding portion of the first lead terminal is in a same plane perpendicular to the surface of the substrate with a boundary portion between the oblique portion and the inserting portion of the second lead terminal.

6 Claims, 5 Drawing Sheets

ELECTRONIC COMPONENT AND MOUNTING STRUCTURE THEREOF

BACKGROUND OF THE INVENTION

1. Field of the Invention

The present invention relates to an electronic component, and particularly to an electronic component having lead terminals so arranged in a zigzag shape, such as a hybrid IC for inserting to a circuit board.

2. Description of the Prior Art

A conventional electronic component is shown in FIG. 7 (a) and FIG. 7 (b), and FIG. 7 (a) is its side view and FIG. 7(b) is its front view. An electronic component 21 includes a substrate 22 made of ceramics and the like. Though it is not shown in figures, pattern electrodes are formed on the substrate 22, and chip parts such as IC, transistor, laminated capacitor and the like are connected to the pattern electrodes. The electronic components 21 includes a lead terminal group consisted of first lead terminals 25 and second lead terminals 26. The first lead terminals 25 and the second lead terminals 26 are connected to one end of the substrate 22 by grasping, and led out toward outside in a same direction. The first lead terminals 25 and the second lead terminals 26 are so arranged in a zigzag shape.

In the first lead terminal 25, a connecting side to the substrate 22 except the grasping portion and an inserting portion side to an external circuit board extend so as to be parallel to the surface of the substrate 22, and are in a same plane.

In the second lead terminal 26, a connecting side to the substrate 22 except the grasping portion and an inserting portion side to the circuit board extend so as to be parallel to the surface of the substrate 22, and are in different planes. The connecting side and the inserting portion side of the second lead terminal 26 are connected with a oblique portion extending in an oblique direction.

However, when the electronic component 21 is mounted on a circuit board 27 by inserting the inserting portion sides of the lead terminals 25 and 26 to through holes 28 of the circuit board 27, the electronic component 21 is slanted as shown in FIG. 8. In this case, the chip parts 23 contact to the other parts (not shown) mounted on the circuit board 27, and the chip parts 23 and the other parts are short-circuited with each other. Further, there is the case that inferior soldering occurs due to the slant of the parts. In the case that the electronic component 21 is slanted, when the distance between adjacent lead terminals 25 and 26 is short, at the time of soldering, the lead terminals 25 and 26 are short-circuited with a solder raised up from the through holes 28 at positions A and B in FIG. 9 via a electrodes 29 surrounding the through holes 28. Even when the electrodes 29 are not formed around the through holes 28, there is the case of the short circuit between the lead terminals 25 and 26 directly.

SUMMARY OF THE INVENTION

It is, therefore, a primary object of the present invention to provide an electronic component which is scarcely slanted at the time of mounting to the circuit board, and to provide a mounting structure of an electronic component.

The present invention is directed to an electronic component comprising: a flat shaped substrate; a first lead terminal connected to one end of the substrate by grasping the substrate, and led out toward an outside of the substrate so as to be parallel to a surface of the substrate, and a connecting side except a grasping portion and an inserting portion side to an external circuit board of the first lead terminal being in a same plane; and a second lead terminal connected to the one end of the substrate by grasping the substrate, and led out toward an outside of the substrate, and a connecting side except a grasping portion and an inserting portion side to a circuit board of the second lead terminal being in a different planes which are parallel to the surface of the substrate and connected with an oblique portion; wherein the first lead terminal has holding portion at an intermediate part of the first lead terminal for preventing the first lead terminal from moving through a hole of the circuit board, and the holding portion and a boundary portion between the oblique portion and the inserting portion are in a same plane substantially perpendicular to the surface of the substrate.

Further, the present invention is directed to a mounting structure of an electronic component comprising: a flat shaped substrate; a first lead terminal connected to one end of the substrate by grasping the substrate, and led out toward an outside of the substrate so as to be parallel to a surface of the substrate, and a connecting side except a grasping portion and inserting portion side to an external circuit board of the first lead terminal being in a same plane; and a second lead terminal connected to the one end of the substrate by grasping the substrate, and led out toward an outside of the substrate, and a connecting side except a grasping portion and an inserting portion side to a circuit board of the second lead terminal being in different planes which are parallel to the surface of the substrate and connected with an oblique portion; wherein an interposing member having a through hole for inserting at least the first lead terminal and having a predetermined thickness and made of insulating material is put on the circuit board, and at least the first lead terminal is inserted to a through hole of the circuit board via the interposing member.

In the electronic component of the present invention, since the holding portion is formed at an intermediate part of the first lead terminal, the first lead terminal is holded at openings of the through holes by the holding member, and the second lead terminal is holded by the boundary portion between the oblique portion and the inserting portion. Since the holding portion of the first lead terminal and the boundary portion of the second lead terminal between the oblique portion and the inserting portion are in a same plane perpendicular to the surface of the substrate, the electronic component is scarcely slanted at the time of mounting to the circuit board.

In the mounting structure of an electronic component of the present invention, when the electronic component is mounted on the external circuit board, since at least first lead terminal is inserted to the through hole of the circuit board via an interposing member, at least first lead terminal is supported with the thickness of both of the circuit board and the interposing member, and hence the electronic component is scarcely slanted.

According to the present invention, the effect that the electronic component is scarcely slanted can be obtained.

The above and other objects, features, aspects and advantages of the present invention will become more apparent from the following detailed description made with reference to the drawings.

DESCRIPTION OF THE PREFERRED EMBODIMENTS

Figure 1A:
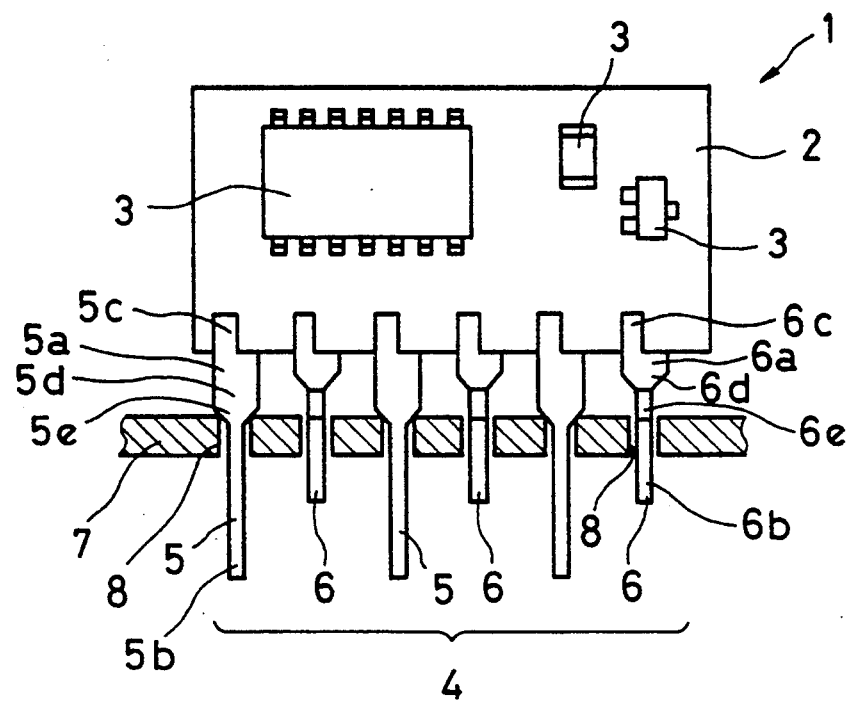
FIG. 1 (a) is a front view showing an electronic component of one embodiment of the present invention mounted on a circuit board, and FIG. 1 (b) is its side view.
Figure 1B:
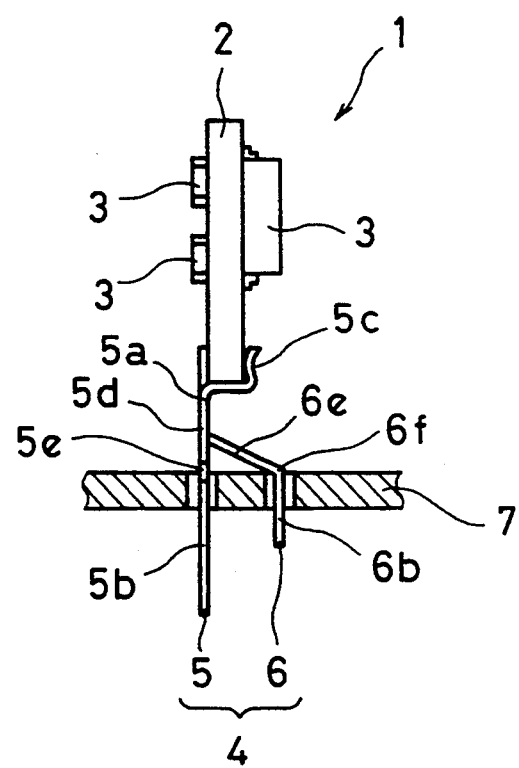

FIG. 1 (a) is a front view showing an electronic component of one embodiment of the present invention mounted on a circuit board, and FIG. 1 (b) is its side view. FIG. 1 (a) and FIG. 1 (b) shows an electronic component 1 such as hybrid IC. The electronic component 1 includes a substrate 2 made of ceramics and the like. Though it is not shown in figures, pattern electrodes are formed on the substrate 2. Chip parts 3 such as IC, transistor, laminated capacitor and the like are connected to the pattern electrodes. The electronic component 1 includes a lead terminal group 4 consisted of first lead terminals 5 and second lead terminals 6. The first lead terminals 5 and the second lead terminals 6 are led out from one side of the substrate 2 toward an outside, and are so arranged in a zigzag shape.

The first lead terminal 5 includes a connecting side 5a for connecting to the substrate 2 and an inserting portion 5b for inserting to an external circuit board 7. The connecting side 5a includes a grasping portion 5c for grasping the substrate 2 and wide and long brim portion 5d extended from the grasping portion 5c. The inserting portion side 5b is formed so as to be narrow as compared with the brim portion 5d. In the first lead terminal 5, the connecting side 5a except the grasping portion 5c and the inserting portion side 5b extend so as to be parallel to the surface of the substrate 2, and are in a same plane. The under end 5e of the brim portion 5d acts as a holding portion against the external circuit board.

That is, the under end 5e of the wide brim portion 5d at an intermediate part of the first lead terminal 5 is used as a holding portion. The under end 5e of the brim portion 5d is in touch with the opening portion of the through hole 8 at an upper surface of the circuit board, and hence the first lead terminal 5 is prevented from inserting to the through hole 8.

The second lead terminal 6 includes a connecting side 6a for connecting to the substrate 2, and an inserting portion side 6b for inserting the second lead terminal 6 to the external circuit board 7. The connecting side 6a includes a grasping portion 6c for grasping the substrate 2, and wide and short brim portion 6d extended from the grasping portion 6c. In the second lead terminal 6, the connecting side 6a except the grasping portion 6c and the inserting portion side 6b extend so as to be parallel to the surface of the substrate 2, and are in a different planes. The connecting side 6a and the inserting portion side 6b are connected with a oblique portion 6e extending in an oblique direction. A boundary portion (folding portion) 6f between the oblique portion 6e and the inserting portion side 6b is in a same plane perpendicular to the surface of the substrate 2 with the holding portion (under portion 5e of the brim portion 5d) at an intermediate part of the first lead terminal 5. The boundary portion 6f acts as a holding portion against the external circuit board 7.

Figure 2:
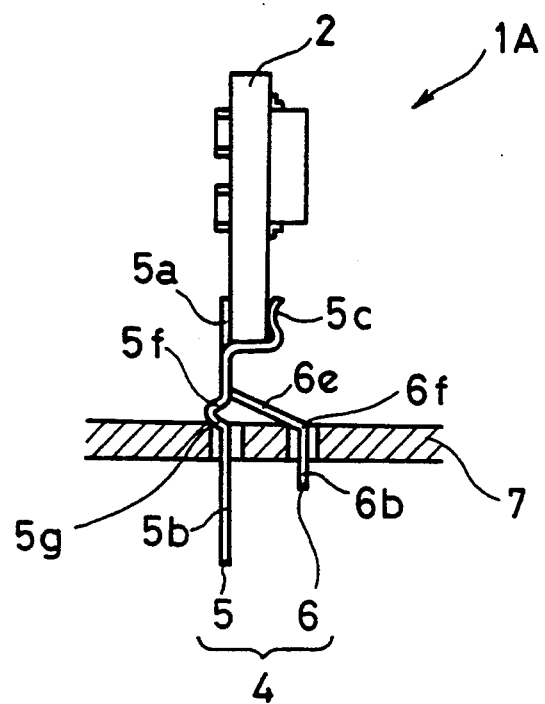
FIG. 2 is a side view showing an electronic component of another embodiment of the present invention mounted on a circuit board.

FIG. 2 is a side view showing a state of mounting an electronic component 1A of another embodiment of the present invention to the circuit board 7. In the electronic component 1A as compared with the electronic component 1 in FIG. 1(a) and FIG. 1(b), a bending portion 5f is formed at an intermediate part of the first lead terminal 5 instead of the brim portion 5d, or by making the brim portion 5d short. An under portion 5g of the bending portion 5f acts as a holding portion similarly to the under portion 5e of the brim portion 5e in FIG. 1(a) and FIG. 1(b). In the electronic component 1A as shown in FIG. 2, the under portion 5g of the bending portion 5f is in a same plane perpendicular to the surface of the substrate 2 with a boundary portion 6f betwen the oblique portion 6e and the inserting portion side 6b of the second lead terminal 6.

Figure 3:
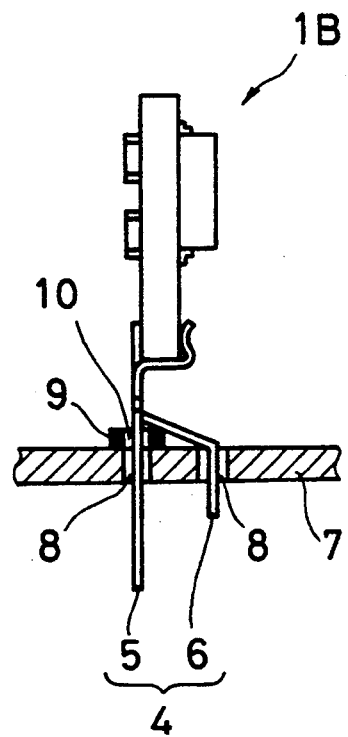
FIG. 3 is a side view showing a mounting structure of an electronic component of one embodiment of the present invention.
Figure 4:
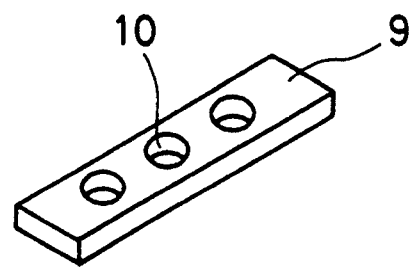
FIG. 4 is an enlarged perspective view showing an interposing member used in a mounting structure of an electronic component of the present invention.
Figure 5:
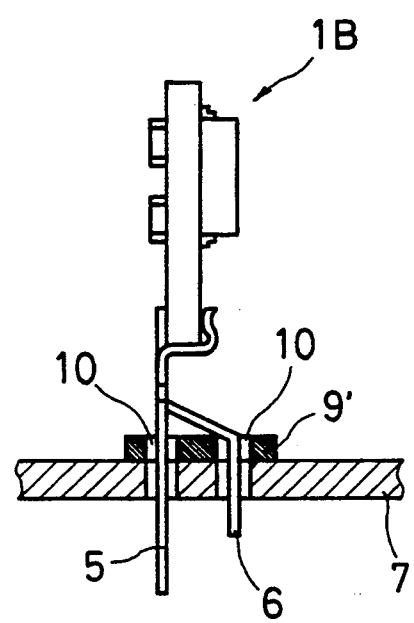
FIG. 5 is a side view showing a mounting structure of an electronic component of another embodiment of the present invention.
Figure 6:
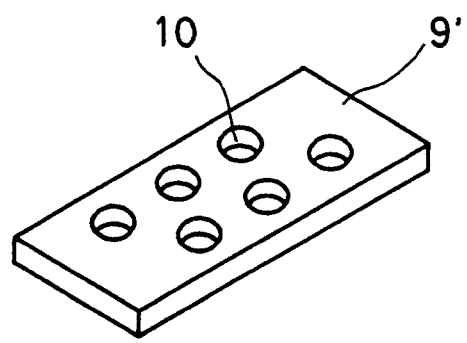
FIG. 6 is an enlarged perspective view showing an another interposing member used in a mounting structure of an electronic component of the present invention.
Figure 7A:
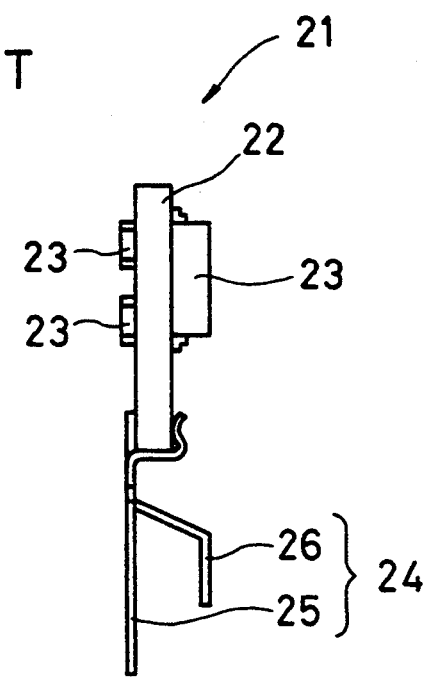
FIG. 7 (a) is a side view showing a conventional electronic component, and FIG. 7 (b) is its front view.
Figure 7B:
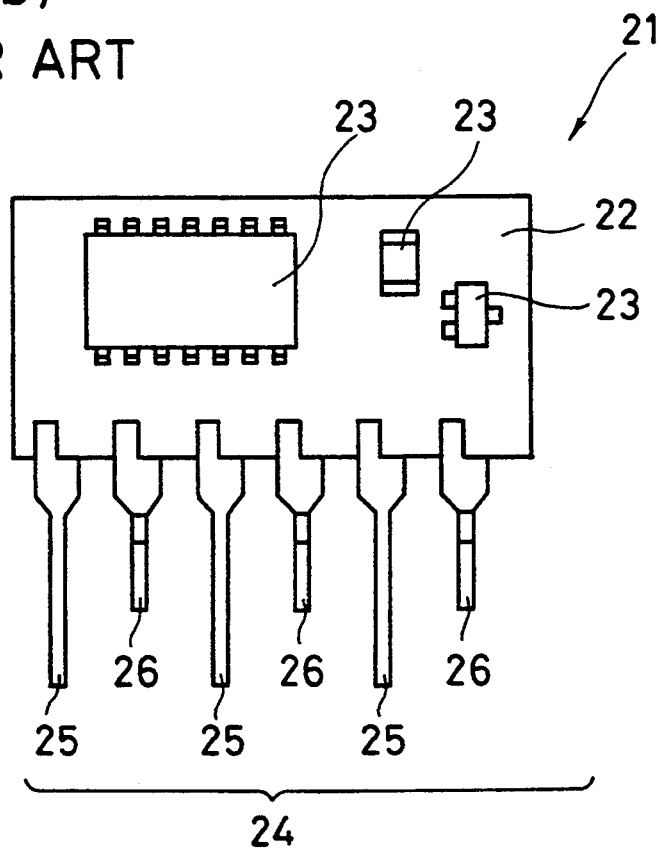
Figure 8:
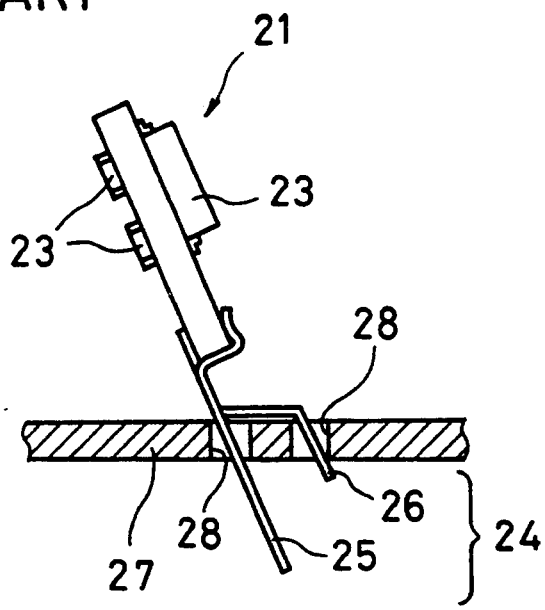
FIG. 8 is a side view showing a state that a conventional electronic component is mounted on a circuit board.
Figure 9:
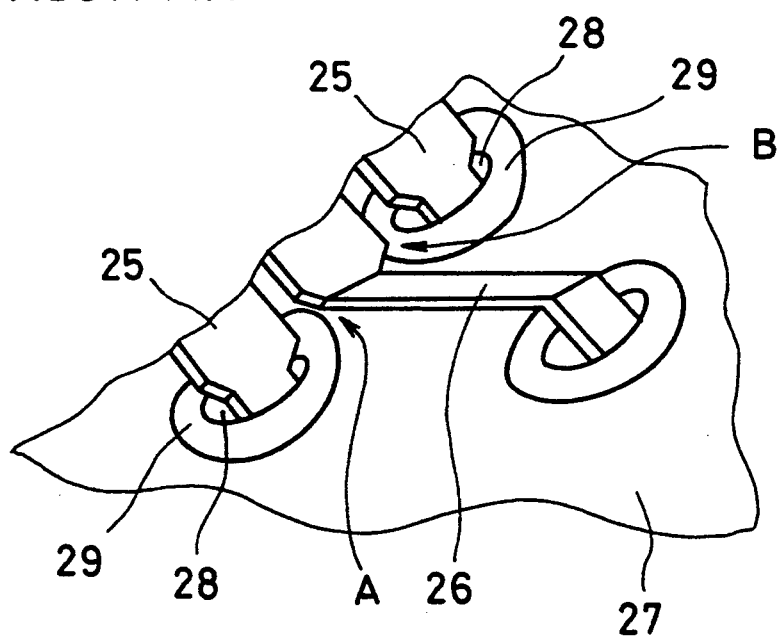
FIG. 9 is an enlarged partial view showing a circuit board in FIG. 8.

FIG. 3 shows an another embodiment of the present invention. An electronic component 1B is mounted on the circuit board 7 by inserting the first lead terminals 5 to the holes of the circuit board 7 via an interposing member 9. The electronic component 1B is the same component with the conventional electronic component 21. The interposing member 9 is made of insulating material such as anti-heat plastics. The interposing member 9 has through holes 10 at positions corresponding to the first lead terminals 5 as shown in FIG. 4. The first lead terminals 5 are inserted into the through holes 10 of the interposing member 9 on the circuit board 7 as shown in FIG. 3, and further inserted into the through holes 8 of the circuit board 7. Therefore, the first lead terminals 5 are supported with both thicknesses of the circuit board 7 and the interposing member 9, and hence the electronic component 1B is scarcely slanted. FIG. 5 shows a state of mounting the electronic component 1B by inserting both of the first lead terminal 5 and the second lead terminal 6 via an interposing member 9'. In the embodiment shown in FIG. 5, the electronic component 1B can be mounted on the circuit board with a stabilization. FIG. 6 shows the interposing member 9' used in FIG. 5.

While the present invention has been particularly described and shown, it is to be understood that such description is used merely as an illustration and example rather than limitation, and the spirit and scope of the present invention is determined solely by the terms of the appended claims.

What is claimed is:

1. An electronic component comprising:
   a flat shaped substrate;
   a first lead terminal connected to one end of said substrate by grasping said substrate, and led out toward an outside of said substrate so as to be parallel to a surface of said substrate, and a connecting side except a grasping portion and an inserting portion side to an external circuit board of said first lead terminal being in a same plane; and
   a second lead terminal connected to said one end of said substrate by grasping said substrate, and led out toward an outside of said substrate, and a connecting side except a grasping portion and an inserting portion side to a circuit board of said second lead terminal being in different planes which are parallel to the surface of said substrate and connected with an oblique portion;
   wherein said first lead terminal has holding portion at an intermediate part of said first lead terminal for preventing said first lead terminal from moving through a hole of said circuit board, and said holding portion and a boundary portion between said oblique portion and said inserting portion side of said second lead terminal are in a same plane substantially perpendicular to the surface of said substrate.

2. An electronic component in accordance with claim 1, wherein said connecting side of said first lead terminal has a wide brim portion, and an under portion of said brim portion is used as said holding portion.

3. An electronic component in accordance with claim 1, wherein a bending portion is formed at an intermediate part of said first lead terminal, and an under portion of said bending portion is used as said holding portion.

4. A mounting structure of an electronic component comprising:
   a flat shaped substrate;
   a first lead terminal connected to one end of said substrate by grasping said substrate, and led out toward an outside of said substrate so as to be parallel to a surface of said substrate, and a connecting side except a grasping portion and an inserting portion side to an external circuit board of said first lead terminal being in a same plane; and
   a second lead terminal connected to said one end of said substrate by grasping said substrate, and led out toward an outside of said substrate, and a connecting side except a grasping portion and an inserting portion side to said circuit board of said second lead terminal being in different planes which are parallel to the surface of said substrate and connected with an oblique portion;
   wherein an interposing member having a through hole for inserting at least said first lead terminal and having a predetermined thickness and made of insulating material is put on said circuit board, and
   at least said first lead terminal is inserted to a through hole of said circuit board via said interposing member.

5. A mounting structure of an electronic component in accordance with claim 4, wherein said interposing member has a through hole for inserting said first lead terminal therein.

6. A mounting structure of an electronic component in accordance with claim 4, wherein said interposing member has through holes for inserting said first lead terminal and said second lead terminal therein.

* * * * *